United States Patent [19]
Yao et al.

[11] Patent Number: 5,521,530
[45] Date of Patent: May 28, 1996

[54] EFFICIENT METHOD AND RESULTING STRUCTURE FOR INTEGRATED CIRCUITS WITH FLEXIBLE I/O INTERFACE AND POWER SUPPLY VOLTAGES

[75] Inventors: Chingchi Yao, Saratoga; Poucheng Wang, Mt. View, both of Calif.

[73] Assignee: Oki Semiconductor America, Inc., Hackensack, N.J.

[21] Appl. No.: 299,004

[22] Filed: Aug. 31, 1994

[51] Int. Cl.$^6$ .............................................. H03K 19/0175
[52] U.S. Cl. .................... 326/80; 326/33; 326/81
[58] Field of Search ................... 326/80–81, 33

[56] References Cited

U.S. PATENT DOCUMENTS

| | | | |
|---|---|---|---|
| 4,853,560 | 8/1989 | Iwamura et al. | 326/80 |
| 5,067,003 | 11/1991 | Okamura | 326/80 X |
| 5,084,637 | 1/1992 | Gregor | 326/81 |
| 5,097,152 | 3/1992 | Kohda et al. | 326/80 |
| 5,387,809 | 2/1995 | Yamagishi et al. | 257/203 |

FOREIGN PATENT DOCUMENTS 404336812A  11/1992  Japan ....................... 326/80

*Primary Examiner*—David R. Hudspeth
*Attorney, Agent, or Firm*—Townsend and Townsend and Crew

[57] ABSTRACT

A semiconductor integrated circuit receives and transmits signals at more than one set of VH/VL voltage levels. The integrated circuit includes a core region, an input pad, an output pad, peripheral circuitry, and a plurality of power supply lines each at power supply voltage levels V1, V2, V3 ... Vm. The integrated circuit also includes input circuitry and output circuitry each of which have buffers and translators. The availability of the power lines each at power supply voltage levels V1, V2, V3 ... Vm and translators allows for the present circuit to transmit and receive various sets of input signals and output signals, all within the same integrated circuit.

27 Claims, 12 Drawing Sheets

EFFICIENT METHOD AND RESULTING STRUCTURE FOR INTEGRATED CIRCUITS WITH FLEXIBLE I/O INTERFACE AND POWER SUPPLY VOLTAGES

BACKGROUND OF THE INVENTION

The present invention relates to semiconductor integrated circuits and the manufacture thereof. The invention is illustrated in an example with regard to an application specific integrated circuit (ASIC) with circuit elements such as power/ground lines, peripheral circuits, and break cells, but it will be recognized that the invention has a wider range of applicability. Merely by way of example, the invention may be applied in other semiconductor integrated circuits such as custom integrated circuits, standard products including at least microprocessors (MICROs) and memory products (MEMORY), programmable circuits, among others.

The design of power/ground lines and peripheral circuits to meet power supply needs for ASICs is generally known in the art. Various power supply voltage levels can be used with different ASIC types to supply power to each of its circuit elements. A conventional ASIC with a core region and peripheral circuits typically operates under a fixed power supply condition. The conventional ASIC often operates at the fixed power supply condition to function under a certain high/low switching level for the specified technology such as TTL (transistor-transistor-logic), ISL/STL (integrated Schottky logic/Schottky transistor logic), ECL (emitter-coupled logic), IIL (integrated injection logic), among others. In addition, the peripheral circuits such as buffers are often designed at such power supply level for a certain high and low ($V_H/V_L$) input/output (I/O) signal level to accommodate the switching level technology.

As integrated circuits become denser and operate at higher speeds, it is often desirable to design integrated circuits using a lower power supply voltage level to improve circuit characteristics such as power consumption, switch speed, reliability, and the like. For example, a conventional ASIC typically uses a power supply voltage level of either 5 volts or 3.3 volts to power-up its circuit elements. This means that such ASIC may operate at either a fixed 3.3 volt or 5 volt power supply level, but generally not both. However, it may occur that a user desires certain characteristics of the 5 volt integrated circuit power supply design and the lower 3.3 volt or even a lower power supply voltage design. The conventional ASIC typically cannot operate at a different power supply voltage level which often limits the use of such ASIC to its fixed power supply voltage level.

In addition, the conventional ASIC which relies upon the fixed power supply voltage condition cannot typically adapt certain pins designed for use with a certain set of $V_H/V_L$ signal levels to another set of high and low signal levels. These problems may be illustrated in a conventional ASIC of FIG. 1.

The conventional ASIC 10 of FIG. 1 illustrates a general ASIC configuration using, for example, CMOS technology. The ASIC includes a core region 13, peripheral circuits 15 such as buffers, I/Os, or the like, and bond pads 17. The core region 13 and peripheral circuits 15 are generally represented as part A and part B, respectively. The core region and peripheral circuits are designed to operate at a fixed power supply voltage level such as 3.3 or 5 volts, and are often limited to such fixed power supply voltage level for a particular ASIC type.

For example, the core region power supply voltage which is designed at 3.3 volt cannot easily be changed to an operating condition of 5 volts when the circuit has been designed with a single 3.3 volt power supply and peripheral buffers also designed at 3.3 volt. In particular, the power routing is typically not designed to allow for the core region to be changed from 3.3 volt operation to 5 volt operation without also changing the power supply level of the peripheral buffers. Accordingly, the conventional ASIC has a core region which may not be changed to a different power supply voltage level.

Certain peripheral circuits and/or buffers cannot easily be adapted in the conventional ASIC to a change in high and low voltage signal levels from one set of signal levels to another different set of signal levels without effecting other peripheral circuits. These circuit elements are typically designed to accommodate a single set of voltage signal levels and therefore may not easily be adapted to accommodate the other different set of high and low voltages which correspond to the signal levels. In addition, should the power supply voltage level that is different from the designed level be applied to the peripheral buffers, certain circuit elements often tend to function improperly.

FIG. 2 depicts a portion 20 of the peripheral circuits for the ASIC of FIG. 1 where a supply voltage level different from the designed level is applied to a CMOS inverter. For illustrative purposes only, inverter 21 and inverter 22 are connected to power bus lines 23 and 24 at 3.3 volts and 5 volts, respectively. Each inverter includes an n-type channel field effect (nMOS) $Q_B$ transistor and a p-type channel field effect transistor (pMOS) $Q_A$, typifying CMOS technology. Inverter 21 includes the 3.3 volt power source at a source/drain of $Q_A$, an input 25, and an output 26. The output 26 from inverter 21 drives inverter 22 which includes a source/drain of $Q_A$ at 5 volts, an input 26, and an output 27. A problem of direct current (DC) power consumption at inverter 22 occurs when the lower 3.3 volt output 26 of inverter 21 drives inverter 22 which has power at 5 volts. DC power consumption often reduces the switching capability of the pMOS transistor 30 at inverter 22, and may effect the signal voltage at the output 27. Further, the existing power bus configuration of the conventional ASIC does not easily adapt to a different power supply level for each inverter as illustrated.

The problems described herein also exist with other integrated circuits such as custom integrated circuits, standard products including at least microprocessors (MICROs) and memory products, gate arrays, programmable circuits, and the like. Such integrated circuits may employ a technology which includes metal oxide silicon field effect transistor (MOS), complementary metal oxide silicon field effect transistor (CMOS), bipolar complementary metal oxide silicon field effect transistor (BiCMOS), bipolar transistor (bipolar), among others.

From the above it is seen that a method and structure is needed for providing variable supply power and/or I/O voltage levels to certain semiconductor integrated circuits elements.

SUMMARY OF THE INVENTION

According to the invention, a method of construction and resulting structure for an integrated circuit allows operation of an integrated circuit with a plurality of different power supply voltage levels at internal circuit elements. The present integrated circuit also allows for a wide range of input and output signal levels, typically corresponding to different sets of high and low signal levels.

In a specific embodiment, the present invention provides a semiconductor integrated circuit which includes a core region, an input pad, an output pad, peripheral circuitry, and a plurality of power supply lines each at one of a plurality of power supply voltage levels V1, V2, V3, . . . , Vm. The present circuit includes an input circuit connected to more than one of the plurality of power supply lines and coupled between the core region and the input pad, and an output circuit connected to more than one of the plurality of power supply lines and coupled between the core region and output pad. Both input circuit and output circuit are portions of the peripheral circuitry. The input circuit is adapted to receive an input signal at one of a plurality of voltage signal levels from the input pad and the output circuit is adapted to transmit an output signal at one of a plurality of voltage signal levels at the output pad. The core region may include a power level at one of a plurality of fixed voltage levels.

In an alternative embodiment, the present invention provides a method for transferring an input signal through a semiconductor integrated circuit. The present method includes the steps of providing a first input signal at one of a plurality of VHin/VLin voltage levels on an input pad which is located on a semiconductor integrated circuit, and sending the input signal through a level shifter. The level shifter is coupled to the input pad. The present method also converts the first input signal from the one plurality of VHin/VLin voltage levels to a second input signal at another voltage level through an input translator. The input translator is coupled to the level shifter. Further, the present method includes a step of transmitting the second input signal for use in a core region of the semiconductor integrated circuit.

A further alternative embodiment provides an integrated circuit which includes a core region having a plurality of cells, and a plurality of circuit element groups B1, B2, B3 . . . Bn each coupled to the core region. Each of circuit element groups includes power lines supplying a plurality of voltages V1, V2, V3 . . . Vm. The present circuit also includes a plurality of pads including an input pad and an output pad coupled to each of the circuit element groups. Each circuit element group also includes an output buffer, which is coupled to more than one of the power lines, to provide an output signal at the one of the plurality of voltages to the output pad.

Each of the circuit element groups in the preceding embodiment further includes an input buffer, which is coupled to more than one of the power lines, to receive a first input signal from the input pad, and provide an input signal at one of the plurality of voltages to the core region.

In each of the embodiments, the input buffer and output buffer of each circuit element group include circuitry which allows the present circuit to receive and transmit signals at more than one set of VH/VL voltage levels. The input buffer includes circuit elements such as an ESD circuit, input driver, level shifter, translator, and the like. The output buffer includes a pre-driver, translator, output driver, and the like. Further circuitry can also be added to either the input or output buffers to provide for the desired input/output signals used in the particular application.

In an alternative embodiment, an integrated circuit with a core region, an input pad, an output pad, peripheral circuitry, and a plurality of power supply lines is also provided. The present integrated circuit provides an output circuit connected to a plurality of power supply lines and coupled between the core region and the output pad. The output circuit is a portion of the peripheral circuitry. The present integrated circuit also has a first power pad connected to one of the plurality of power supply lines. The pad supplies one of a plurality of first power supply voltage levels V1, V2 . . . $V_m$ (m>1). The output circuit transmits an output signal with reference to one of a plurality of first power supply voltage levels.

A further embodiment to the preceding embodiment includes an input circuit connected to a plurality of power supply lines and coupled between the core region and the input pad. The input circuit is also a portion of the peripheral circuitry. The present integrated circuit also provides a second power pad connected to one of plurality of power supply lines. The second power pad supplies one of a plurality of second power supply voltage levels V1, V2 . . . $V_n$ (n>1). The input circuit transmits an input signal with reference to one of plurality of second power supply voltage levels.

From the above, it is seen that the present invention provides for multiple conditions of power supply voltages at the interface circuits to accomodate a plurality of high and low voltage signal levels at the I/O's.

A further understanding of the nature and advantages of the present invention may be realized by reference to the latter portions of this specification and attached drawings.

DESCRIPTION OF SPECIFIC EMBODIMENTS

Figure 3:
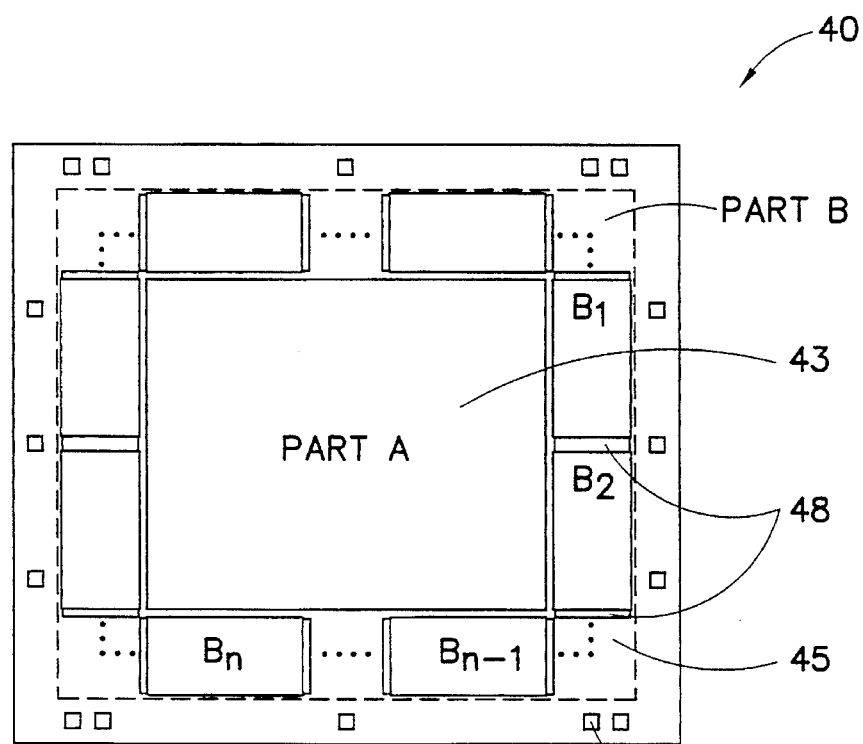
FIG. 3 is a configuration of the present integrated circuit.

FIG. 3 is a chip configuration for an integrated circuit 40 according to the present invention. The present circuit is, for example, an ASIC, but it will be recognized that the invention has a wider range of applicability. The present circuit 40 generally includes a core region 43, peripheral circuits 45 (referring to the elements located between the core region and dashed line), and bonding pads 47.

The core region may include various cell elements such as gates in a gate array, a central processing unit in a microprocessor, memory cells for memory chips, various combinations thereof, among others (collectively represented as PART A). The core region has the capability of being operated at a fixed power level of 0.5 volt, 1.0 volt, 2.5 volts, 3.3 volts, 5.0 volts, 8.0 volts, 10 volts, 20 volts, and others. In this ASIC example, the core region 43 includes cells comprising gates.

Figure 1:
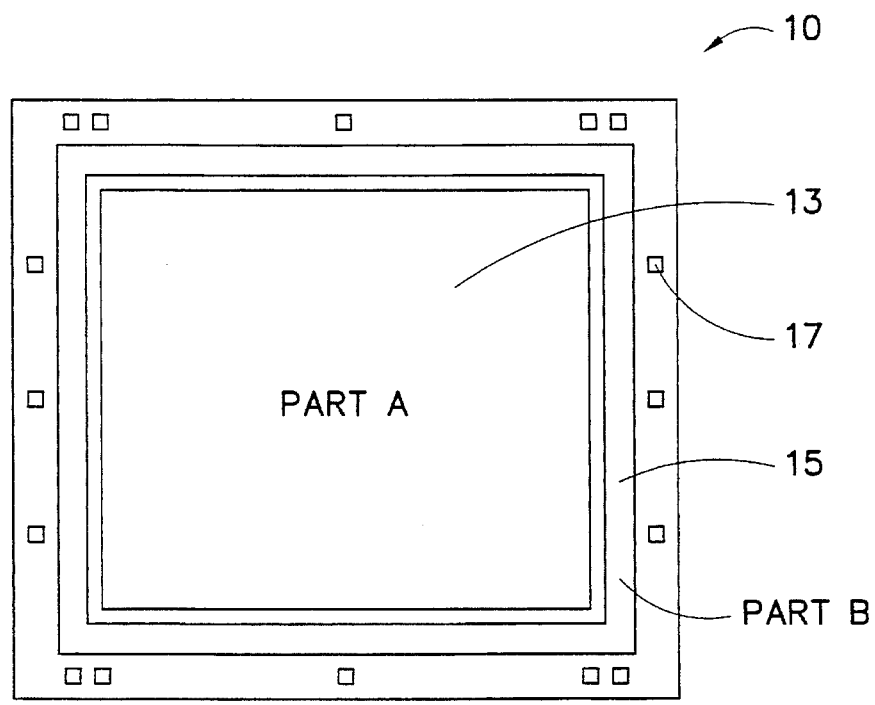
FIG. 1 is a configuration of a prior art application specific integrated circuit chip.
Figure 2:
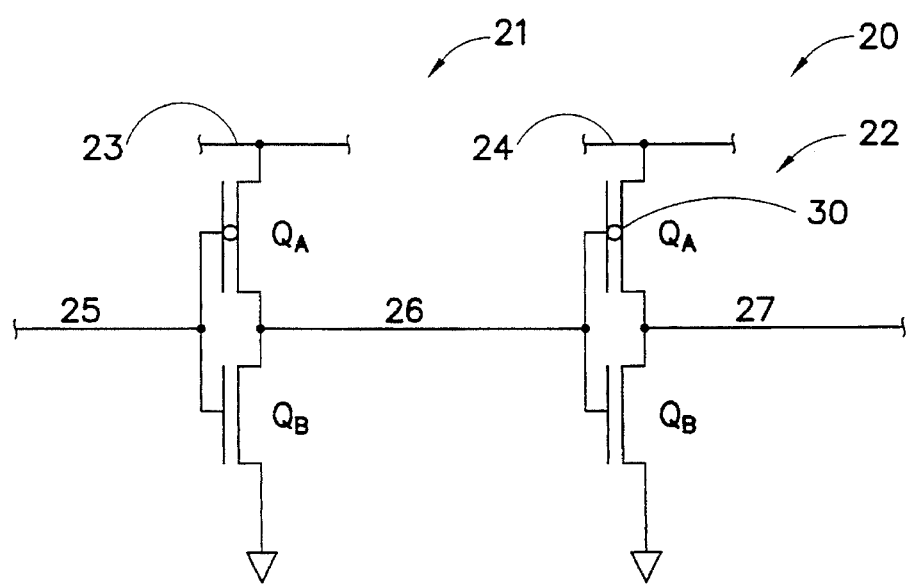
FIG. 2 is an example of a CMOS inverter operating at a power supply level which is different from its designed level.

The peripheral circuits 45 that include interface circuitry include at least input buffers, output buffers, and bi-directional input/output buffers (collectively represented as PART B). It should be noted that the peripheral circuits need not be limited to circuits located at the periphery of the semiconductor. Peripheral circuits may also be formed at a center region or the like of the semiconductor as well as its periphery. The interface circuits in PART B can be represented as n (a number greater than 1) individual circuit element groups B1, B2, B3 . . . Bn, each of which may be separated in part by a power break cell 48. The prior art integrated circuit of FIG. 1 does not include multiple circuit element groups B1, B2, B3 . . . Bn nor power break cells according to the present invention.

Power break cells are integrated circuit structures including metallization and isolation structures which allow for circuitry in each circuit element group B1, B2, B3 . . . Bn to be isolated at least in part from another circuit element group. The power break cell may also be used to isolate circuitry in a circuit element group and connect that circuitry to a different power supply voltage level by use of a power bus line connected to a power pad at such voltage level. The power break cell circuitry often isolates circuitry of circuit element groups from each other by forming an open circuit in a power bus line which could be shared among circuitry of different circuit element groups, often adjacent to each other. Further details of the power break cell are described in the later portions of this specification.

A circuit element group such as B1, B2, B3 . . . Bn may include certain power supply voltage levels V1, V2, V3 . . . Vm (m>1) which typically differ from each other. For example, circuit element group B1 may have multiple power supply voltage levels V1, V2, V3 . . . Vm or a single power supply voltage level such as V1 or V2 or another. Circuit element group B2 may also have multiple power supply voltage levels or a single power supply voltage level. The other circuit element groups may also have either multiple power supply voltage levels or a single power supply voltage level. Of course, the exact configuration for each circuit element group depends upon the particular application. A power supply often includes a voltage at either 20 volts, 10 volts, 8.0 volts, 5.0 volts, 3.3 volts, 2.5 volts, 1.0 volt, 0.5 volts, among others.

A circuit element group has input buffers, output buffers, and bi-directional buffers each at a certain power supply voltage level either VB1, VB2, VB3 . . . VBn. The input buffers (also called receivers) and output buffers (or drivers) connect via signal lines to respective bonding pads, typically input and output pads. The availability of different power supply voltage levels at each circuit element group B1, B2, B3 . . . Bn allows for flexibility in circuit design and in particular the power supply and/or I/O signal needs for the particular integrated circuit.

Electronic signals perpetuating through the integrated circuit generally flow between the core region 43 and the bonding pads 47. Such electronic signals are typically characterized by either a high or a low voltage signal level, typically corresponding to a respective "ON" or "OFF" state, and other signal levels. The interface circuits represented as circuit element groups B1, B2, B3 . . . Bn facilitate communication between the core region and the bonding pads. The bonding pads provide an interface between the integrated circuit and external circuitry. Wires and/or other connection means connect the bonding pads to lead means which allow the integrated circuit to communicate to the external circuitry. By way of the availability of various power supply voltage levels at each of the circuit element groups, the present integrated circuit may accommodate desired I/O's and/or pins for more than one set of high/low signal levels. These signals include input signals, output signals, bi-directional signals, and combinations thereof.

Figure 4:
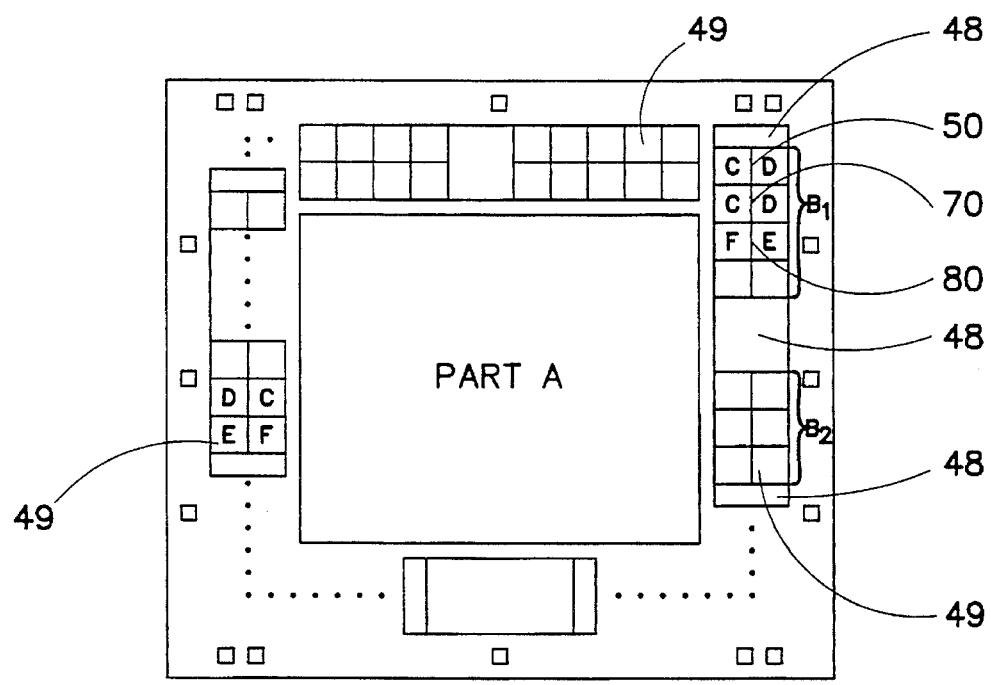
FIG. 4 is a configuration of peripheral circuitry for the circuit of FIG. 3.

A configuration of the circuit element groups B1, B2, B3 . . . Bn for the ASIC example is illustrated in FIG. 4. The core region and peripheral circuitry that includes the circuit element groups B1, B2, B3 . . . Bn are shown. Each circuit element group B1, B2, B3 . . . Bn may include interface circuitry embodied as BLOCKS C, D, E, and F. It should be noted that each region 49 as illustrated represents a BLOCK which may include a portion of an input buffer, an output buffer, a bi-directional buffer, and combinations thereof. As an example, BLOCKS C and D combined each corresponds to output buffers 50, 70 and BLOCKS E and F combined correspond to an input buffer 80. BLOCKS C, D, E, and F define typical circuit elements which form each circuit element group B1, B2, B3 . . . Bn.

The various BLOCKS such as C, D, E, and F, within each circuit element group in FIG. 4 can be designed to meet the needs of the particular application. A circuit element group having desired BLOCK types (C, D, E, and F) may share a common power bus line with circuitry of another circuit element group. Alternatively, at least two circuit element groups B1, B2, B3, . . . Bn may have a power break cell 48 in between. The power break cell isolates portions of the circuit element groups from each other such that at least portions of each may be at a different power supply voltage level via a connection to a power pad having a different power supply voltage level.

Figure 5:
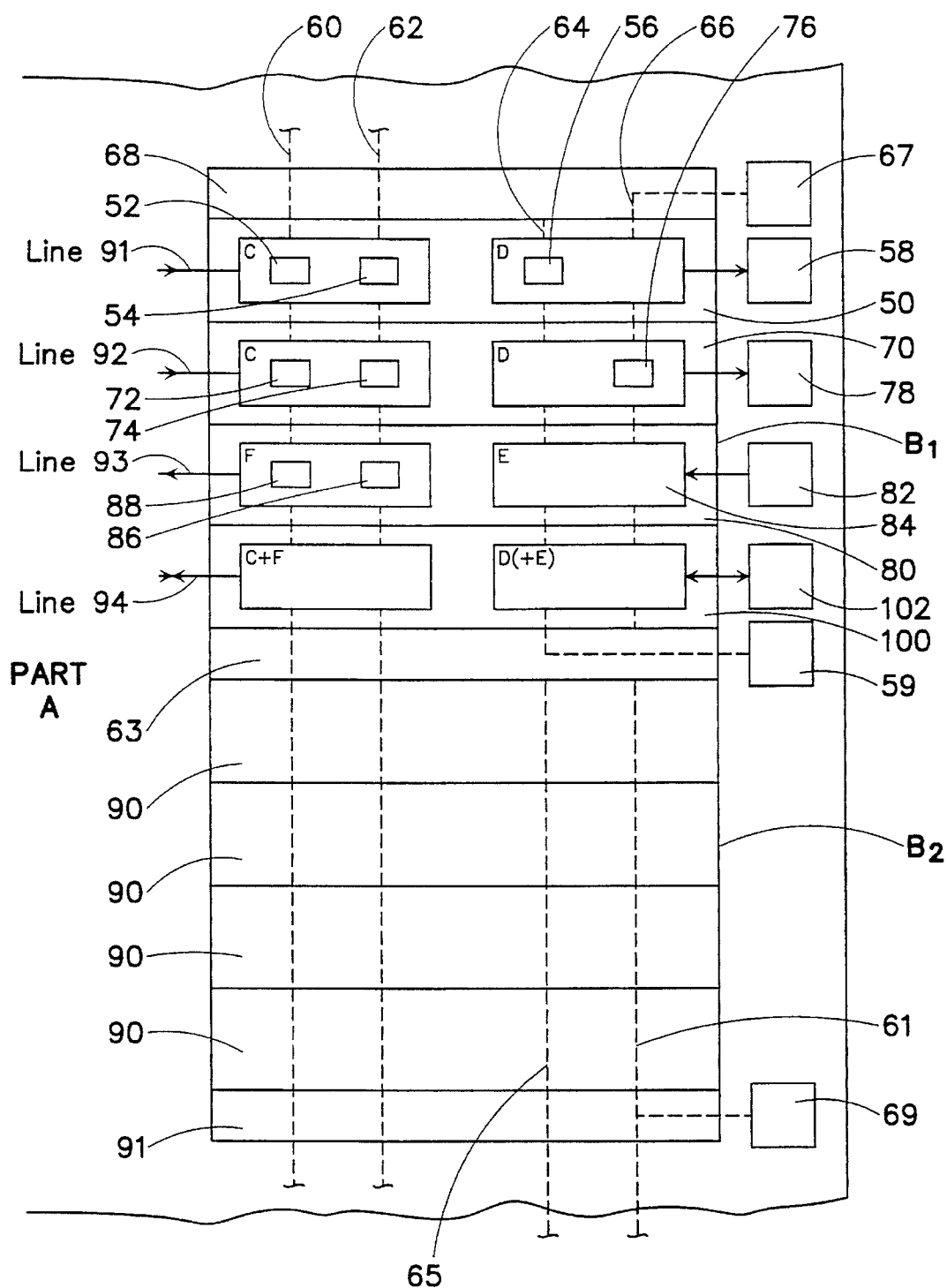
FIG. 5 is an illustration of input/output buffers for the circuit of FIG. 3.

FIG. 5 is an illustration of certain BLOCKS C, D, E, and F which may be embodied in circuit element groups B1 and B2 of the ASIC example. In circuit element group B1, the output buffers 50, 70 include circuit elements such as translators 52, 72 and pre-drivers 54, 74, output drivers 56, 76, and the like. The power for these elements may be supplied by power bus lines 60, 62, 64, and 66, each of which may be at a different respective power supply voltage level V1, V2, V3, and V4.

A typical output signal flows at either line 91 or line 92 (refer to direction of arrows) from PART A, through BLOCK C, through BLOCK D, and to an output pad 58, 78. The multiple output buffers, defined by the translators 52, 72, pre-drivers 54, 74, and output drivers 56, 76 and the availability of different power supply voltage levels V1, V2, V3, and V4, are designed to allow for the output of signals at various high and low voltage level sets. Each voltage level set which includes a high/low voltage component (VHout/VLout) typically corresponds to output switching levels for a particular technology such as TTL, ISL/STL, ECL, IIL, among others. More than one set of high/low voltage signal levels may correspond to each of the technologies.

The output drivers 56, 76 can be any suitable larger-sized buffer capable of providing for various output signal levels and current drivability needed for the particular application.

The larger-sized buffers may include various types currently known in the art such as TTL, CMOS, and others. The larger-sized output drivers can also be similar in design typically for ease in routing and circuit layout.

Each output driver connects to a certain power supply condition by use of a metal via and a power bus line. As an example, output driver 56 is coupled to power bus line 64 and power pad 59, both at voltage V3, and output driver 76 is coupled to power bus line 66 and power pad 67, both at voltage V4. Each power bus line provides the desired voltage at each output driver to allow for the proper output signal level and current drivability.

The translators 52, 72 convert output signals to provide for the various output signal levels. Each translator converts the output signal from either a lower voltage signal level with reference to a lower power voltage level to a higher voltage signal level with reference to a higher power voltage level or a higher voltage signal level with reference to a higher power voltage level to a lower voltage signal level with reference to a lower voltage signal level. The translator is typically coupled to a pre-driver. The translators 52 and 72 are coupled to pre-drivers 54 and 74, respectively. Depending upon the layout of the power lines among other features, the location of the pre-driver can either precede or follow the translator.

The power bus lines 60, 62, 64, and 66 supply power at V1, V2, V3, and V4, respectively, to BLOCK C and BLOCK D. The power bus lines 60, 62, 64, and 66 also typically lay in parallel to each other and are often coupled to certain elements in each BLOCK. Power bus line 60 at V1 is coupled to translators 52 and 72 of BLOCK C, and power bus line 62 is coupled to pre-drivers 54 and 74 also of BLOCK C. The power lines 60 and 62 are typically fixed at either a higher-voltage-to-lower-voltage sequence or a lower-voltage-to-higher-voltage sequence for routing and design ease. In BLOCK D, power bus lines 64 and 66 are coupled to output drivers 56 and 76, respectively. The power bus lines 64 and 66 are set at a voltage sequence depending upon the particular application.

Input circuitry in circuit element group B1 includes an input protection circuit 84 (represented as BLOCK E), a level shifter 86 and a translator 88 (collectively represented as BLOCK F), and power bus lines 60, 62, 64, and 66. As previously noted, the power bus lines are at a voltage level of V1, V2, V3, and V4, respectively.

An input signal either high or low propagates at line 93 from an input pad 82, through the input protection circuit 84, through the level shifter 86 and the translator 88, and to PART A, the core region of the ASIC circuit. The combination of BLOCK F, and optional BLOCK E, with power lines at V1, V2, V3, and V4, adapts the various sets of input signals, each having a high/low voltage component (VHin/VLin).

BLOCK F includes input level shifter 86 and preferably translator 88. The level shifter can be any suitable buffer and the like. The level shifter typically adjusts the voltage level of the incoming input signal to accommodate the signal for any voltage level variations to an outgoing input signal. Both the outgoing and incoming signal levels are referenced to the same power voltage level. The translator can be of any suitable design such as a differential amplifier and the like or any other suitable design known in the art. The translator adapts the input signal at a first voltage level with reference to a first power voltage level to an input signal at a second voltage level with reference to a second power voltage level. The first and second signal levels are typically different, but may be the same in some applications. The input signal at the second voltage level can be used in the core region (PART A) of the ASIC while the input signal at the first voltage level may not always be used effectively by the core region. For design and routing ease, translator 88 is located in the same row as translators 52 and 72 in BLOCK C when the pre-driver follows the translator. Other configurations are also possible depending upon the particular application.

The input protection circuit 84 can be any suitable ESD protection circuit typically known in the art. If the ASIC uses CMOS technology, it is often desirable to set the n-type well of the p-type channel device at a voltage level no lower than the highest input voltage level allowed, to properly reverse bias the p-type drain/n-type well junction region. In the CMOS example, the ASIC uses p-type channel devices which are fabricated in n-type well regions, and n-type channel devices which are fabricated in p-type well regions. The input protection circuit may also include other circuit elements such as an input buffer, and the like.

The power bus lines 60, 62, 64, and 66 also supply power at V1, V2, V3, and V4, respectively, to BLOCK F and BLOCK E. Power bus line 60 at V1 is coupled to the translator 88 in BLOCK F, and power bus line 62 at V2 is coupled to the input level shifter 86. As noted above, power lines 60 and 62 are at voltages which either sequentially increase or decrease from the core region for routing and design ease. In BLOCK E, power bus lines 64 and 66 are coupled to at least the ESD protection circuit, and optionally the input buffer. Depending upon the voltage level of the input signal received from the input pad 82 and the needs of the signal level at BLOCK F, the ESD protection circuit may be coupled to either power bus line 64 at V3 or power bus line 66 at V4 to suit the particular application.

The input and output buffers described above each includes its own bond pad, that is, the input buffer 80 has its input pad 82 and the output buffers 50 and 70 have their respective output pads 58 and 78. These input and output buffers are often unidirectional. However, certain applications can require an input buffer and an output buffer to share a common pad such as the bi-directional buffer 100 configuration of FIG. 5. Accordingly, in an alternative embodiment, an input buffer and output buffer are combined to form a bi-directional buffer connected to a common pad 102.

The bi-directional buffer 100 typically includes certain circuit elements of both the input buffer 80 and the output buffers 50, 70. The bi-directional buffer combines BLOCK C and BLOCK F to form BLOCK C+F, corresponding to at least an input translator, level shifter, output translator, and pre-driver. Preferably, in designing BLOCK C+F, the circuit elements of BLOCK C should be geometrically close or even adjacent to the elements of BLOCK F to allow BLOCK C+F to fit into the desired region of the semiconductor.

The bi-directional buffer 100 also combines BLOCK D with BLOCK E to form BLOCK D+E, corresponding to an output driver and input protection circuit. Optionally, the input protection circuit can be eliminated from the circuit when the output driver has a suitable size such that the output driver provides enough ESD protection for the integrated circuit elements.

The power bus lines 60, 62, 64, and 66 further supply power at V1, V2, V3, and V4, respectively, to BLOCK C+F and BLOCK D+E. The availability of the power bus lines 60, 62, 64, and 66 at the various voltage levels and the circuit elements of BLOCKS C+F and D+E allow the bi-directional buffer to be adapted to receive and transmit an input signal and an output signal, respectively, at more than one set of voltage signal levels.

The embodiment of FIG. 5 also illustrates circuit element group B2 which includes various buffers 90, often either an input buffer, an output buffer, a bi-directional buffer, combinations thereof, or the like. Circuit element group B2 also includes power lines 60, 62, 65, and 61 at voltages V1, V2, V5, and V6, respectively. Of course, the type of buffer used and the voltage level supplied to each buffer will depend upon the particular application.

The voltage applied to each buffer among the circuit element groups B1 and B2 is often set by the use of power break cells and power bus lines. In the ASIC example, power for the circuitry to BLOCK C, BLOCK F, and BLOCK C+F in circuit element group B1 are shared by the circuitry contained in buffers 90 of circuit element group B2 through use of power lines 60 and 62. Accordingly, the power lines 60 and 62 which lay in parallel to each other can be shared by both circuit element groups B1 and B2. The use of voltages at the power but lines that either increase or decrease in sequence from the core region allow for design and routing ease among the circuitry in the circuit element groups B1, B2, B3 . . . Bn.

Alternatively, power supplied to circuitry of a circuit element group can be isolated from circuitry contained in another circuit element group by the use of the power break cell. For example, power break cell 63 opens power lines 66 and 64 from power lines 65 and 61, respectively, and connects power line 64 to power pad 59 at voltage V3. Power break cell 68 opens power line 64, and connects power line 66 to power pad 67 at voltage V4. Power break cell 91 connects power line 61 to power pad 69 at voltage V6. Typical voltage levels at power lines 60, 62, 64, 66, 65, and 61 include voltages of 20 volts, 10 volts, 8 volts, 5 volts, 3.3 volts, 2.5 volts, 1 volt, 0.5 volts, among others. The multiple power lines at voltages of V1, V2, V3, V4, V5, and V6, circuit element group structures B1 and B2, and use of power break cells allow for certain elements of each circuit element group to be isolated and at a different power voltage level from circuitry of another circuit element group. This combination of structures allows the present invention to adapt various voltage signal levels at the inputs, outputs, and inputs/outputs.

In a specific embodiment, the present method and structure therefor are implemented in a CMOS gate array integrated circuit structure. The detailed features illustrated by way of the CMOS gate array example can also be implemented in other applications, and therefor should not limit the scope of the invention as claimed.

Figure 6:
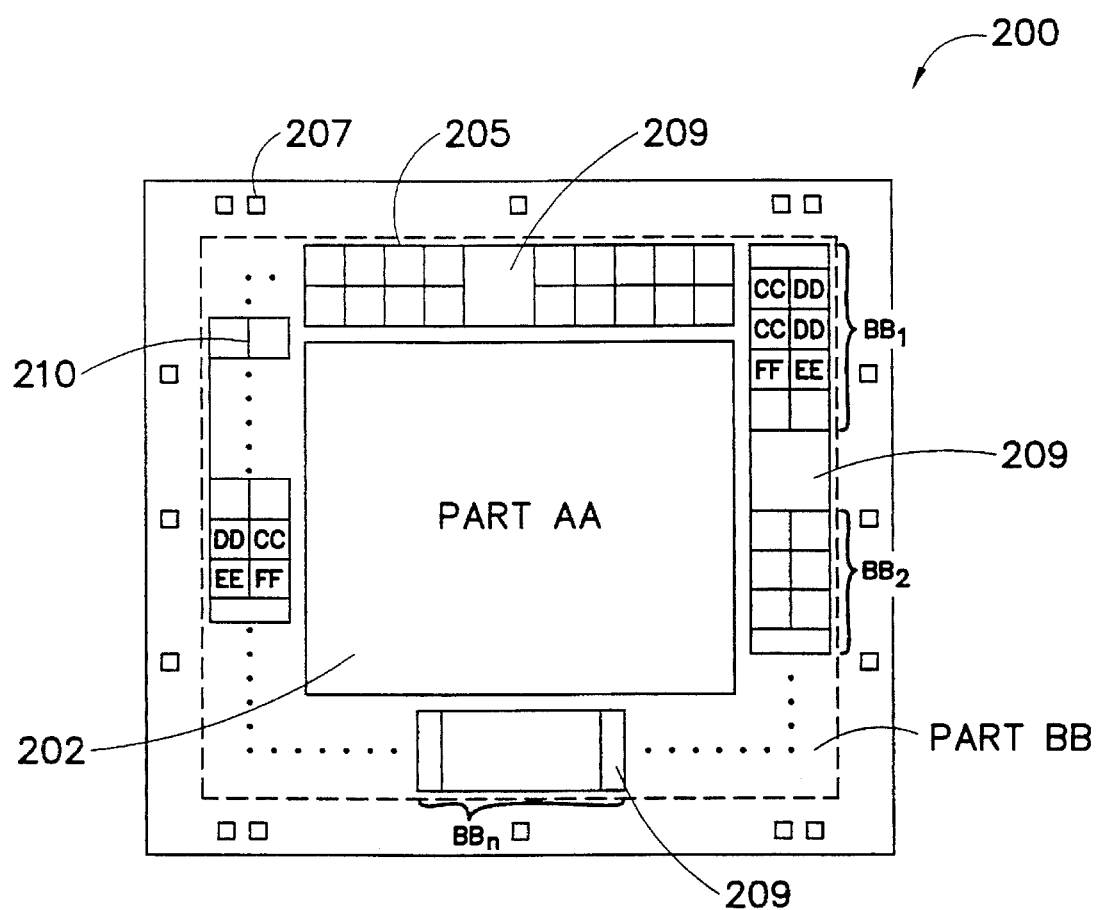
FIG. 6 is a configuration for a CMOS gate array embodiment according to the present invention.

FIG. 6 is a configuration of a CMOS gate array 200 according to the present invention. The gate array includes a core region 202 (represented as PART AA), peripheral circuits 205 including at least I/O buffers (collectively represented as PART BB), and bond pads 207. (It should be noted that PART BB is defined by the region between the dashed line and PART AA.) The peripheral circuits generally allow for communication to occur between the core region 202 and bond pads 207. The core region is made of thousands or even millions of microscopically small cells including n-type well and p-type well CMOS devices.

The core region operates at a power supply voltage from about 0.5 volt to about 20 volts and others, and preferably at either 3.3 volts or 5 volts. The power supply voltage at the core region is typically fixed at a desired voltage level for the particular CMOS application. But the peripheral circuits may have multiple power supply voltage levels. This provides for peripheral circuits which can receive and transmit I/O signals with reference to more than one set of power voltage levels.

Like the preceding embodiment, the peripheral circuits (or PART BB) include interface circuits such as input buffers, output buffers, input/output buffers, among others. PART BB is separated into many circuit element groups BB1, BB2, BB3 . . . BBn, typically isolated from each other in part through a power break cell 209. As previously noted, the power break cells can be used to isolate circuitry in one circuit element group from circuitry in another, and may also provide for a different power supply voltage level at certain circuitry at the isolated circuit element group via a power bus line and power pad. Of course, power can also be supplied to the circuit element by use of a power bus line and power pad.

The power supply voltage level for circuitry at each circuit element group may differ or even be the same as circuitry of another circuit element group. The power supply voltages at circuit element groups BB1, BB2, BB3 . . . BBn, each may include voltage levels of V10, V20, V30 . . . . Vm, typically corresponding to voltages such as 20 volts, 10 volts, 8 volts, 5 volts, 3.3. volts, 2.5 volts, 1 volt, or 0.5 volts, among others. For example, circuit element group BB1 may have multiple power supply voltage levels V10, V20, V30 . . . Vm or a single power supply voltage level such as V10 or V20 or another. Circuit element group BB2 may also have multiple power supply voltage levels or a single power supply voltage level. The other circuit element groups may also have either multiple power supply voltage levels or a single power supply voltage level. Of course, the exact configuration for each circuit element group depends upon the particular application. Preferably, the voltage levels at each circuit element group will include at least 3.3 volts and 5 volts.

In the CMOS example, the core region power supply voltage level is at 3.3 volts or 5 volts. The power supply voltage level at each circuit element group is set by the use of power break cells and the availability of 3.3 volt and 5 volt power bus lines. Of course, the power supply voltage levels at a particular circuit element group will depend upon the application.

Each circuit element group represents a set of buffers and interface circuitry (collectively represented as reference numeral 210) capable of providing communication between the core region and the bond pads. The buffers may be input buffers or output buffers or input/output buffers, each of which can also include other interface circuitry. The buffers include circuits such as translators, pre-drivers, output drivers, level shifters, ESD protection circuits, and the like which are depicted by BLOCKS CC, DD, EE, and FF. Each circuit element group will be tailored with various BLOCKS (CC, DD, EE, and FF) to meet the needs of the particular application.

Figure 7:
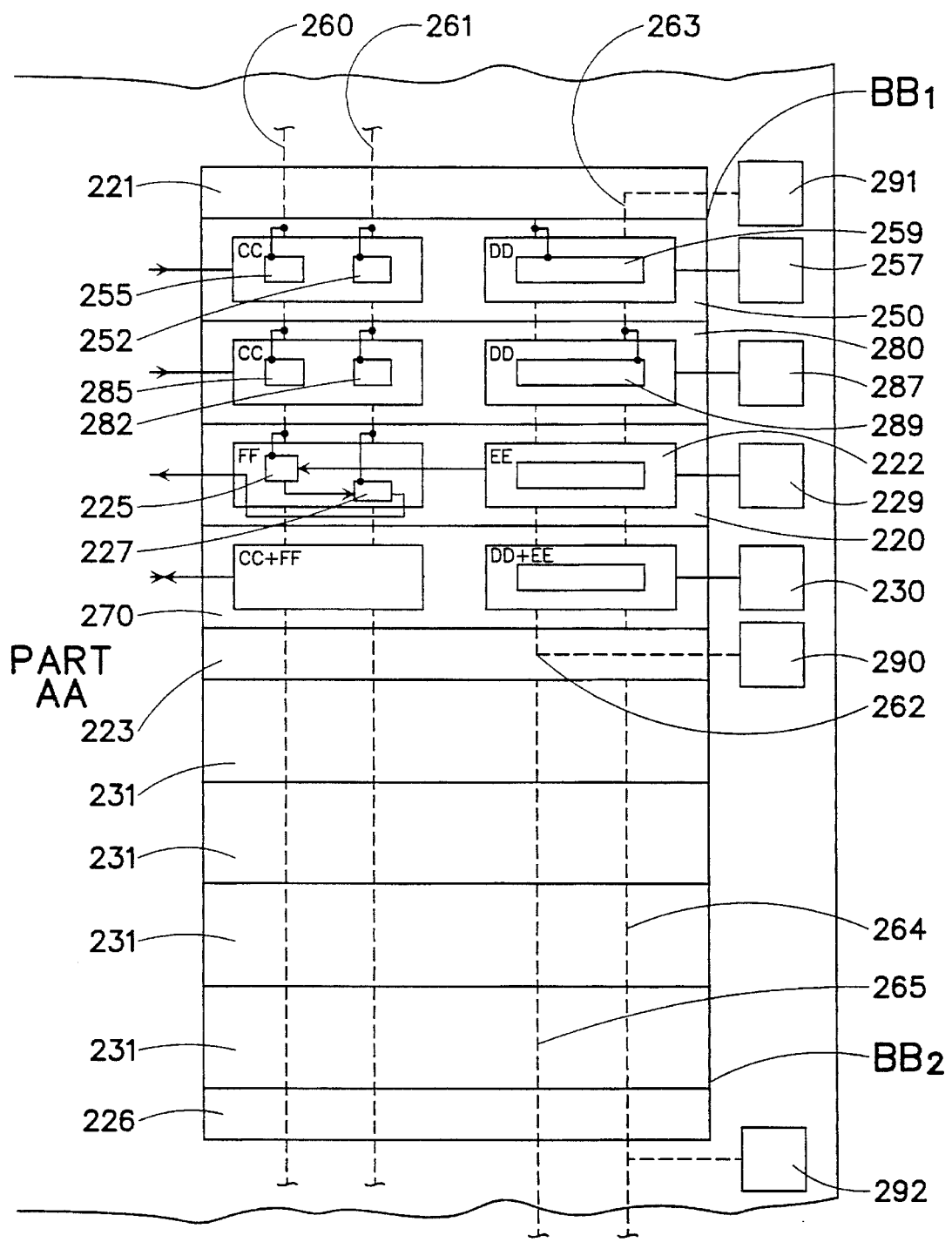
FIG. 7 is a configuration of input/output buffers for the circuit of FIG. 6.

FIG. 7 is an illustration of circuit element groups BB1 and BB2 in the CMOS integrated circuit of FIG. 6. The output buffers 250, 280 include at least translators 252, 282 and pre-drivers 255, 285 (collectively represented as BLOCK CC) and output drivers 259, 289 (represented as BLOCK DD). An output signal generally flows from the core PART AA, through BLOCK CC, through BLOCK DD, and to an output bond pad 257, 287. The output signal then propagates from the output bond pad 257, 287, through a connection means, and out to external circuitry.

The output 259, 289 (BLOCK DD) can be any suitable larger-sized CMOS inverter, typically with desired output levels (VHout/VLout) and current drivability. In the CMOS example, output driver 259 is coupled to power bus line 262 and power pad 290 at voltage V30, and output driver 289 is coupled to power bus line 263 and power pad 291 at voltage V40. Each of the output drivers or CMOS inverters includes an isolated n-type well for the p-type channel pull-up transistor. The isolated n-type well allows for the use of a different power voltage level.

Figure 8:
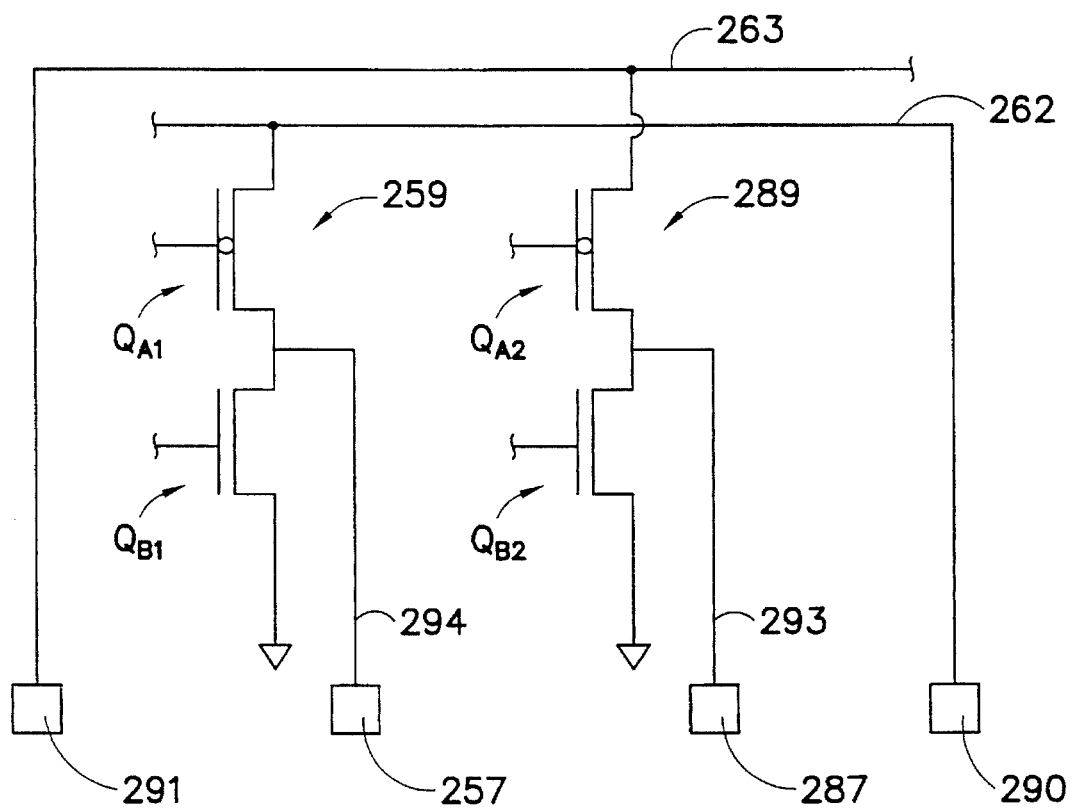
FIG. 8 is an example of a CMOS output buffer according to the present invention.

FIG. 8 illustrates an example of isolated CMOS inverters used as output drivers 259 and 289 of BLOCK DD. Both CMOS inverters 259 and 289 include PMOS transistors QA1, QA2 (pull-up) and NMOS transistors QB1, QB2. Power bus line 262 connects power pad 290 at voltage V30 to a source/drain of PMOS transistor QA1, and the output of CMOS inverter 259 is coupled to output line 294 and to output pad 257. Power bus line 263 connects power pad 291 at voltage V40 to a source/drain of PMOS transistor QA2, and the output of CMOS inverter 289 is coupled to output line 293 and to output pad 287. This configuration of the inverters, power bus lines, and pads allows the output signals to be with reference to power voltage levels of V30 and V40, typically at either 3.3. volts or 5 volts depending upon the application.

In routing BLOCK DD of FIG. 7, power lines 262 and 263 can be fabricated from metal layers which lay in parallel to each other over BLOCK DD. For example, two power lines located at a second metal layer lay in parallel to each other over the PMOS pull-up transistor of the CMOS inverter. Metal VIAs are used to connect the first metal layer which is in contact with the source/drain of the pull-up transistor.

The translators 252, 282 and pre-drivers 255, 285 of BLOCK CC adapts output signals received from the core region to accommodate them for use at external circuitry. The translator either precedes or follows the pre-driver. If the translator follows the pre-driver, an output signal propagates from the core region, through the pre-driver, and then through the translator. Alternatively, when the translator precedes the pre-driver, an output signal propagates from the core region, through the translator, through the pre-driver which drives the output driver.

In the CMOS embodiment, the pre-driver precedes the translator as illustrated in BLOCK CC of FIG. 7. Translators 252 and 282 connect to power line 261 at voltage V20, and pre-drivers 255 and 285 connect to power line 260 at voltage V10. Power lines 260 and 261 supply power to BLOCK CC, and lay parallel to each other. Power line 260 which is near the core region (PART AA) of BLOCK CC is at voltage V10 typically 3.3 volts (or the lowest power voltage) and power line 261 which is near the outer end of BLOCK CC is at voltage V20, typically 5 volts (or the highest power voltage).

Figure 9:
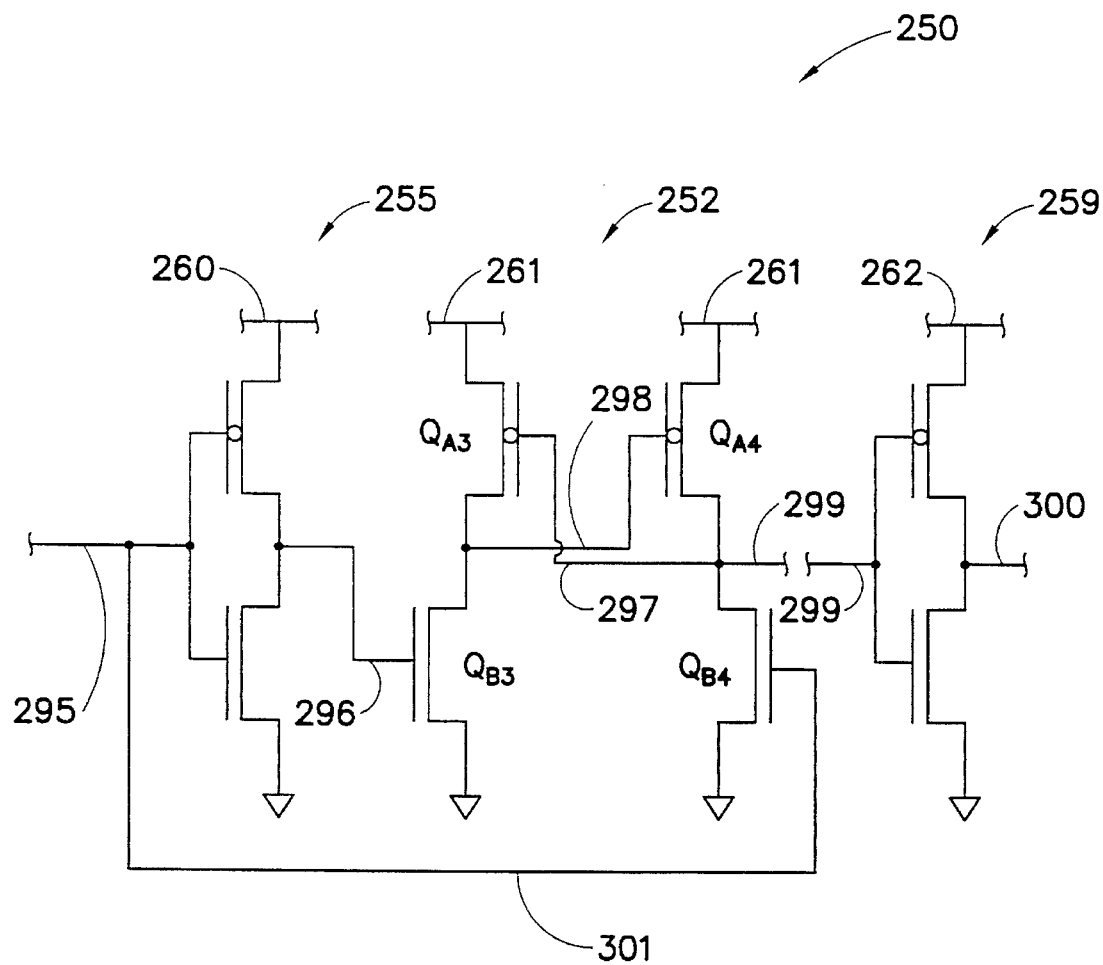
FIG. 9 is an example of a translator for a CMOS output buffer according to the present invention.

FIG. 9 illustrates an example of the CMOS translator 252 used for BLOCK CC in circuit diagram form. FIG. 9 also illustrates a circuit diagram for the CMOS pre-driver 255 and output driver 259. The pre-driver 255 is coupled to power bus line 260 at 3.3 volts (or the lowest power voltage) and to signal line 295 from PART AA. The pre-driver also includes an output connected through signal line 296 to an input of translator 252. The output buffer 259 includes an input received from an output of translator 252 and an output connected to signal line 300. The output buffer is also coupled to power bus line 262 at either 3.3 volts or 5 volts, depending upon the particular application.

The translator 252 is coupled between the output of pre-driver 255 through signal line 296 and the input of output driver 259 through signal line 299. The translator 252 includes PMOS transistors QA3 and QA4 where the source/drain of each PMOS is connected to power bus line 261 at 5 volts (or the highest power voltage), and NMOS transistors QB3 and QB4 where a source/drain is connected to ground. The gate of PMOS transistor QA3 is coupled to the output of transistors QA4 and QB4 through line 297. The gate of PMOS transistor QA4 is coupled to the output of transistors QA3 and QB3 through line 298. The gate of NMOS transistor QB3 is coupled through line 296 to an output of pre-driver 255. The gate of NMOS transistor QB4 is coupled through line 301 to the input of pre-driver 255 through signal line 295.

Figure 14:
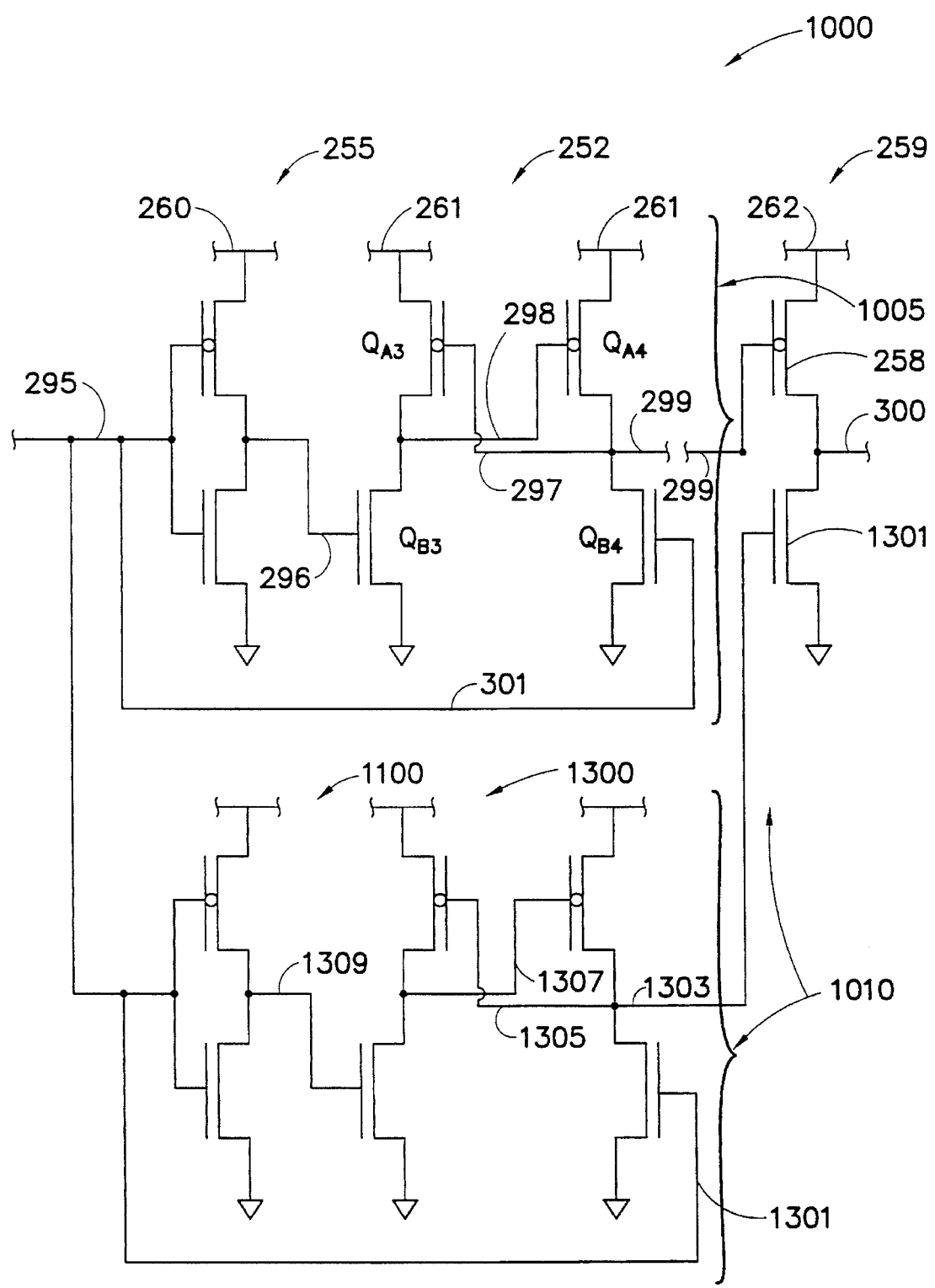
FIG. 14 is an alternative example of a translator for a CMOS output buffer according to the present invention.

FIG. 14 is an alternative example of translators for a CMOS output buffer 1000 according to the present invention. The output buffer 1000 generally includes some of the same elements as the output buffer 250 illustrated by FIG. 9. The same elements are represented by the same reference numerals used for the FIG. 9 example.

The top group 1005 of invertors which includes pre-driver 255 and translator 252 provide an output signal through line 299 to the pull-up transistor 258 of the output driver 259. The top group 1005 includes the same type of elements as the FIG. 9 example except that the output 299 of translator 252 is coupled to the pull-up 258 transistor of the output driver 259 and not the pull-down 1301 transistor.

The output buffer 1000 also includes another group 1010 of invertors defined by pre-driver 1100 and translator 1300. An output 1303 of translator 1300 is coupled to a gate of pull-down transistor 1301 of output driver 259. The input 295 of the output buffer is coupled to the input of pre-driver 255 and pre-driver 1100. An output 1309 of pre-driver 1100 is coupled to a gate of a first pull-down transistor of translator 1300. A gate of a first pull-up transistor of the translator 1300 is coupled to the output 1303 of translator 1300. A gate of a second pull-down transistor of translator 1300 is coupled to the input 295 of the pre-driver 1100. A gate of a second pull-up transistor of translator 1300 is coupled to the drain/source node of the first pull-up and pull-down transistors.

The use of pre-drivers 255 and 1100 allow for the slew between a low and a high output signal to be adjusted to a desired level. Typically pre-drivers 255 and 1100 rely upon pull-up and pull-down transistors of different size for slew or timing adjustment between the high and low output signals. This configuration provides control over the slew rate of the output at line 300.

The input buffer 220 of FIG. 7 includes at least an ESD protection circuit 222, input level shifter 225, input translator 227, among other circuit elements. The input translator and input level shifter are collectively represented as BLOCK FF, and the ESD protection circuit is depicted by BLOCK EE. An input signal generally propagates from the bond pad 229, through the ESD protection circuit 222, through the level shifter 225, through the input translator 227, and to the core region (PART AA).

The input translator is typically of similar design as the output translator (or translators 252 and 282) for ease in routing and design. In this embodiment, the input translator 227 is coupled to power line 261 at 5 volts (or the highest power voltage) and receives the input signal from the input level shifter 225.

The input level shifter 225 can be any suitable CMOS buffer capable of adapting the input signal to the desired input level (VHin/VLin). The input level shifter 225 is coupled to power line 260 at 3.3 volts (or the lowest power voltage), and receives the input signal from the ESD protection circuit 222 (BLOCK EE). The input level shifter adapts the input signal and transmits the adapted input signal to the input translator.

The input signal at BLOCK FF performs a "wraparound" such that the input signal flows by the translator 227, propagates through the input level shifter 225, turns-around back toward the translator 227, propagates through the translator 227, and turns-around back towards the core region. Typically, the amount of "wraparound" should be reduced in a particular application for ease in routing and design. By way of "wraparound" through the input buffer 220, the output buffers 250 and 280 do not have signal lines that "wraparound." Accordingly, the amount of "wraparound" has been reduced by the configuration in circuit element group B1.

The CMOS embodiment also includes a bi-directional buffer 270 where an input buffer and an output buffer share a common pad 230. The bi-directional buffer includes the circuitry of both the input buffer (BLOCK FF and BLOCK EE) and output buffers (BLOCK CC and BLOCK DD). The bi-directional buffer combines BLOCK FF with BLOCK CC to form BLOCK CC+FF such that the circuitry of both BLOCK CC and BLOCK FF preferably lay close to each other, as close as design tolerances allow. BLOCK CC+FF includes at least a pre-driver, output translator, input translator, and level shifter. The output driver of BLOCK DD typically provides enough ESD protection by itself without the use of an input protection circuit. Optionally, the bi-directional buffer can, however, combine BLOCK DD with BLOCK EE to form BLOCK DD+EE which provides the circuitry for ESD protection. The circuitry of both BLOCK DD+EE also lay close to each other for ease in design. BLOCK DD+EE includes an output driver, an ESD protection circuit, and the like.

The power lines 260, 261, 262, 263, 264, and 265 at voltages of V10, V20, V30 V40, V50, and V60 supply power to the BLOCKS located in circuit element groups B1 and B2. The various circuit elements contained in circuit element group B1 were previously described. The circuit elements of each cell 231 in circuit element group B2 may also contain input buffers, output buffers, and input/output buffers, combinations thereof, and the like. Of course, the exact configuration of each cell depends upon the particular application.

The voltages levels at each of the power lines for the CMOS example are as follows. In this example, 3.3 volt and 5.0 volt power supplies are used. As previously noted, the voltages V10 and V20 are at 3.3 volts and 5 volts, respectively. The voltages V30, V40, V50, and V60 may be at either 3.3 volts or 5 volts or another, depending upon the application. Power lines 260 and 261 lay in parallel to each other and are shared by circuitry of circuit element groups B1 and B2. Power line 262 receives power at voltage V30 from power pad 290, supplies power to the circuitry of circuit element group B1, and is also isolated from its adjacent circuit element groups by power break cells 221 and 223. Power line 263 receives power from power pad 291, supplies power to the circuitry of circuit element group B2, and is also isolated from its adjacent circuit element groups by power break cells 221 and 223. As further illustrated, power line 264 receives power at voltage V50 from power pad 292, supplies power to the circuitry of circuit element group B2, and is isolated from circuit element group B1 by use of power break cell 223. Power line 264 is also shared by the circuit element group adjacent to circuit element group B2 opposite of circuit element group B1. Power line 265 supplies power to the circuitry of circuit element group B2, receives power from a region outside of circuit element group B2, and is also isolated from circuit element group B1 by use of power break cell 223. The various power lines and buffers in each circuit element group allow for the use of various input and/or output signals.

Figure 10:
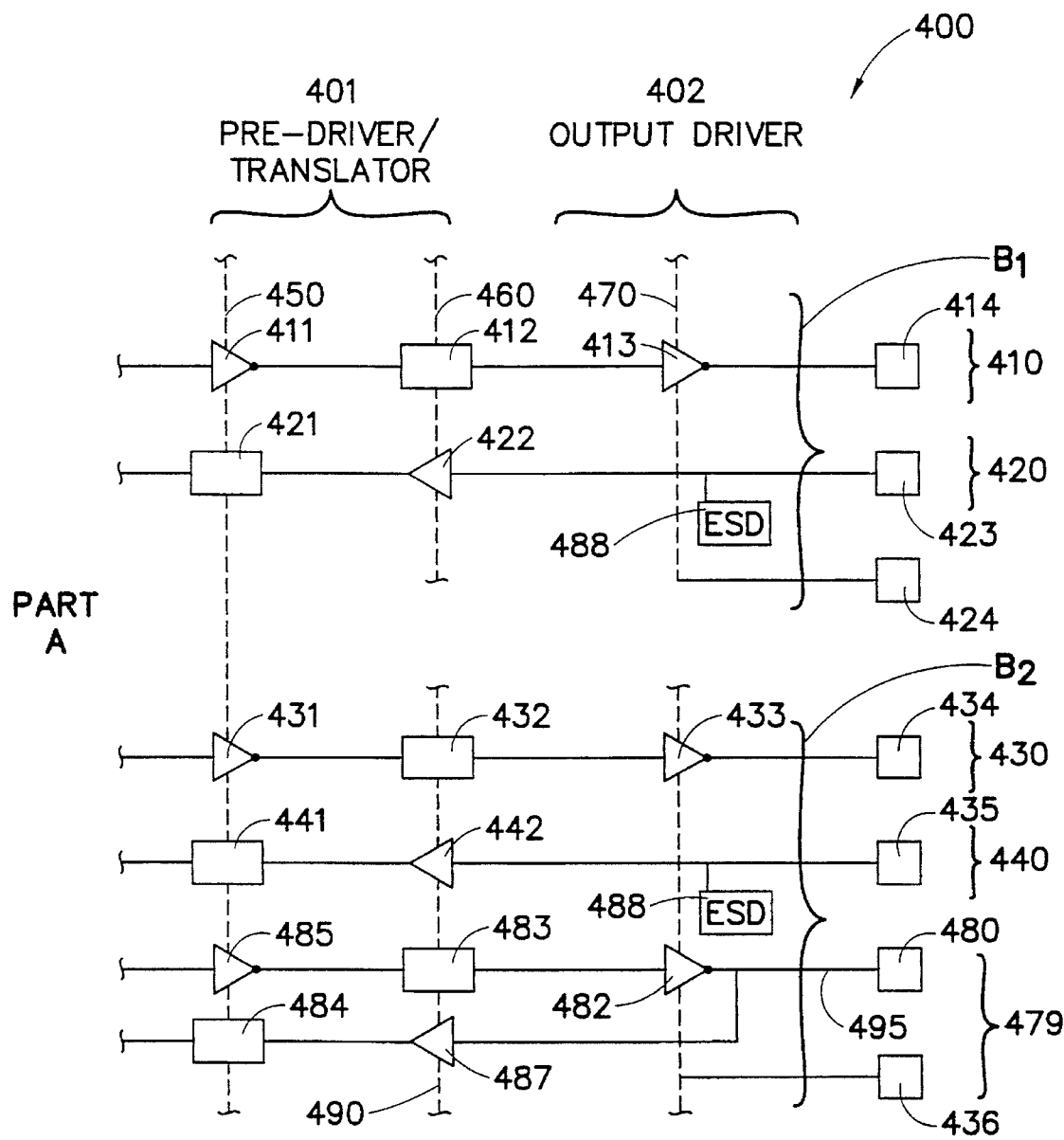
FIG. 10 is an embodiment of input/output buffers in circuit diagram form according to the present invention.

An alternative embodiment of circuit element groups B1 and B2 is illustrated by the circuit diagram 400 of FIG. 10. The circuit diagram includes circuit element groups B1 and B2, and a core region (PART A), typically having cells. Each circuit element group B1 or B2 separates into a pre-driver/translator region 401 and output driver region 402.

Circuit element group B1 includes an output buffer 410 and an input buffer 420. The output buffer 410 includes a pre-driver 411, translator 412, and output driver 413. The pre-driver is coupled to power bus line 450 at voltage V1, and the translator is coupled to power bus line 460 at voltage V2, and the output driver 413 is coupled to power bus line 470 at voltage V3. Power bus line 470 receives voltage at V3 from power pad 424. The input buffer 420 includes a input driver 422 and an input translator 421. Preferably, an ESD protection circuit 488 precedes the input driver. The input driver 422 is coupled to power bus line 460 at voltage V2 and the input translator 421 is coupled to the power bus line 450 at voltage V1.

The availability of translators 412 and 421 and power bus lines at voltage V1, V2, and V3 allow circuit element B1 to accommodate certain input and output signals. The voltage level V1 at power bus line 450 is typically the same potential as the power supply level at the core region (or PART A) of the integrated circuit. The voltage level V2 at power bus line 460 is typically the same as the voltage level V3 at power bus line 470. By way of this configuration, circuit element B1 adapts an output signal with reference to power voltage level V1 from the core region to an output signal with reference to power voltage level V2 (or V3 which is the same voltage level in this embodiment). Circuit element B1 also adapts an input signal with reference to a certain voltage level to an input signal with reference to power voltage level V1 to be used at the core region or PART A.

Circuit element B2 includes an output buffer 430, an input buffer 440, and a bi-directional input/output buffer 479. The input buffer 430 includes a pre-driver 431, translator 432, and output driver 433. The pre-driver 431 is coupled to power bus line 450 at voltage V1, and the translator 432 is coupled to power bus line 490 at voltage V4, typically different from voltage V1. The output driver 433 is coupled to power bus line 495 at voltage V5, typically the same voltage level as voltage V4. Power bus line 495 receives power at voltage V5 from power pad 436, and is isolated from circuit element group B1, through the use of a power break cell. The input buffer includes an input driver 442 and input translator 441. The input driver is coupled to power line 490 at voltage V4, and the input translator is coupled to power line 450 at voltage V1. Preferably, the input buffer also includes ESP circuitry 488. The bi-directional buffer 479 includes a pre-driver 485 coupled to a output translator 483 which is coupled to a output driver 482. The bi-directional buffer also has a input level shifter 487 coupled to an input translator 484. Both the input level shifter and output driver connect to input/output pad 480. Power line 490 in circuit element group B2 is isolated from power line 460 in circuit element group B1 through the use of the power break cell.

Translator 432, output driver 433, and power lines 490 and 495 allow an output signal with reference to power voltage level V1 to be adapted to an output signal with reference to power voltage level of V4 (or V5 which is at the same voltage level in this embodiment). Translator 441 and input driver 442 allow an input signal to be adapted with reference to power voltage level V1 for use in the core region of the integrated circuit. The use of the output translator 483 and input translator 484 allow for output and input signals to be adapted for use at external circuitry and the core region, respectively. Of course, other circuit variations at different voltages may exist depending upon the particular application. In addition, in a further variation to this embodiment, the pre-driver may follow the translator.

Figure 11:
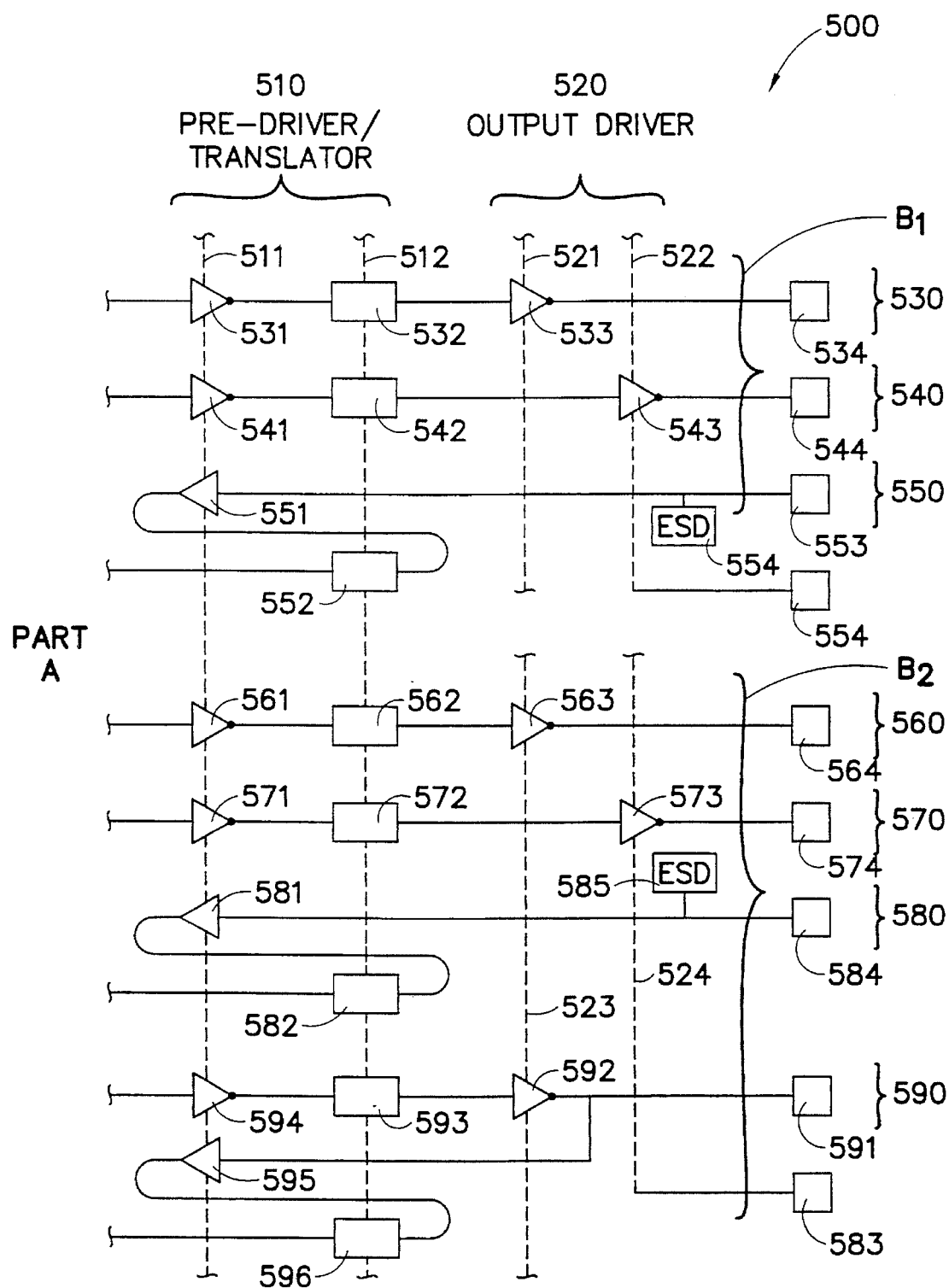
FIG. 11 is an alternative embodiment of input/output buffers in circuit diagram form according to the present invention.

A further alternative embodiment 500 of circuit element groups B1 and B2 and core region (PART A) according to the present invention is illustrated by FIG. 11. Circuit element groups B1 and B2 each include a pre-driver/translator region 510 and an output driver region 520. The embodiment 500 allows for the output of signals with reference to voltage levels of V3, V4, V5, and V6 at output pads 530, 540, 560, and 570, respectively. The embodiment 500 also allows for input signals received at various voltage levels to be adapted to a signal voltage level which is suitable for use at the core region with reference to power voltage level V1.

Circuit element group B1 includes two output buffers 530 and 540, and an input buffer 550. Each of the output buffers include a pre-driver 531, 541, translator 532, 542, and output driver 533, 543. In the pre-driver/translator region of the output drivers, each of the pre-drivers and output drivers are coupled to power bus lines 511 and 512, respectively. Power bus lines 511 and 512 lay in parallel to each other and are at voltages V1 and V2, respectively. Typically V1 is the lowest power voltage level and V2 is the highest power voltage level. Output driver 533 is coupled to power bus line 521 at a voltage V3, and output driver 543 is coupled to power bus line 522 at voltage V4. Accordingly, the output signals at output pads 530 and 540 are with reference to power voltages of V3 and V4, respectively.

The input buffer 550 includes an input driver 551, ESD protection circuit 554, and an input translator 552. The input translator is similar in design to translators 532 and 542 at the output buffers, and therefore may preferably lay in-line with each other for ease in routing and design. The input signal propagates from the input pad 553, through the input buffer 551, and through the input translator 552, before reaching the core region (or PART A). The input signal performs a "wraparound" at the pre-driver region of the input buffer for ease in routing and design. As previously noted, the amount of "wraparound" in a circuit element group should preferably be reduced by the particular design of the integrated circuit.

Circuit element group B2 includes output buffers 560 and 570, input buffer 580, and bi-directional buffer 590. The pre-drivers 561 and 571 are both coupled to power bus line 511, and translators 562 and 572 are both coupled to power bus line 512. Power lines 511 and 512 are shared among circuitry in circuit element groups B1 and B2. Output driver 563 is coupled to power bus line 523, and output driver 573 is coupled to power bus line 524 which receives power from power pad 583 at voltage V5. A power break cell isolates power lines 523 and 524 in circuit element group B2 from circuitry in circuit element group B1. The input buffer 580 has an input pad 584, ESD protection circuit 585, level shifter 581, and input translator 582. The bi-directional buffer includes a pre-driver 594, translator 593, and output driver 592. A level shifter 595 and input translator 596 is also provided. Both the level shifter 595 and output driver 592 are coupled to input/output pad 591. In a further modification of the preceding embodiment, the pre-driver follows the translator.

In an further alternative embodiment, the present invention may be implemented where one side or portion of the semiconductor includes peripheral buffers in a circuit element group at a fixed power supply voltage level or levels. Power break cells are likely to be used to separate the peripheral buffers at the fixed voltage level or levels from the remaining circuit elements. This embodiment of the integrated circuit provides circuit element groups with both flexible and fixed I/O interface circuits.

Figure 12:
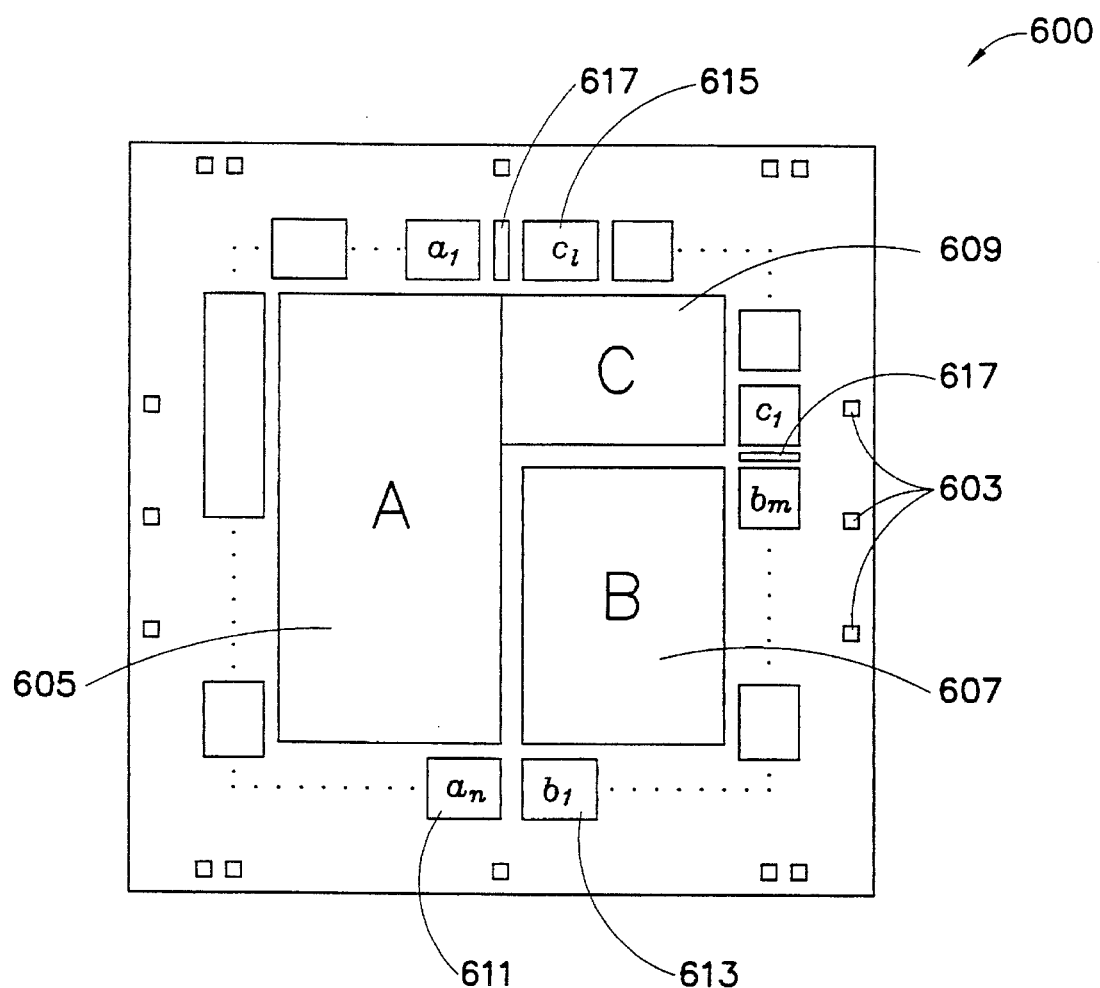
FIG. 12 is an alternative embodiment of the present integrated circuit.

An alternative embodiment of the present invention is illustrated by the integrated circuit device 600 of FIG. 12. The integrated circuit device 600 has multiple core regions A, B, and C, and respective peripheral circuitry regions in the form of circuit element groups A1, A2, A3 . . . $A_n$ (collectively defined as group A), B1, B2, B3 . . . $B_m$ (collectively defined as group B), and C1, C2, C3 . . . $C_l$ (collectively defined as group C). A plurality of bond pads 603 are also defined on the integrated circuit device 600. Power break cells 617 may be used to separate circuit element groups from each other, and may also be used to supply different power levels to the circuit element groups.

Each of the core regions often have different types of cells therein, typically corresponding to any known suitable cell structure. The core regions may also be operated at a different fixed voltage levels such as 0.5 volt, 1.0 volt, 2.5 volts, 3.3 volts, 5.0 volts, 8.0 volts, 10.0 volts, 20 volts, and others. Though the core regions of FIG. 12 are illustrated at a central portion of the semiconductor, such core regions may also occupy other regions of the semiconductor such as an edge, and others.

Each of the peripheral circuitry regions as defined as group A, group B, group C, and others, has its respective core region A, B, C, and others. For example, the circuitry of group A facilitates the inputs to and outputs from core region A, the circuitry of group B facilitates the inputs to and outputs from core region B, and so on. Each of the group A circuit elements A1, A2, A3 . . . $A_n$ may have corresponding power voltage levels of VA1, VA2, VA3 . . . $VA_i$. Each element of groups B1, B2, B3 . . . $B_m$ also may have corresponding voltage levels of VB1, VB2, VB3 . . . $VB_j$, and each of groups C1, C2, C3 . . . $C_l$ may have voltage levels of VC1, VC2, VC3 . . . $VC_k$. Of course, the actual voltage used at any of the circuit element groups depends upon the particular application. The different voltage levels supplied to each of the groups may come from the use of different power lines and power break cells.

The circuitry of each group may include input buffers, output buffers, bi-directional buffers, combinations thereof, and others. The output buffers can have circuit elements such as translators, pre-drivers, output drivers, and other circuit elements. The input buffers may include input protection circuits, translators, level shifters, and other circuit elements. The bi-directional buffers may have any combination of the previously described elements of either the input and output buffers. The peripheral circuitry of FIG. 12 is located on the outer region of the semiconductor. But such peripheral circuitry may also be formed on another portion of the semiconductor.

Figure 13:
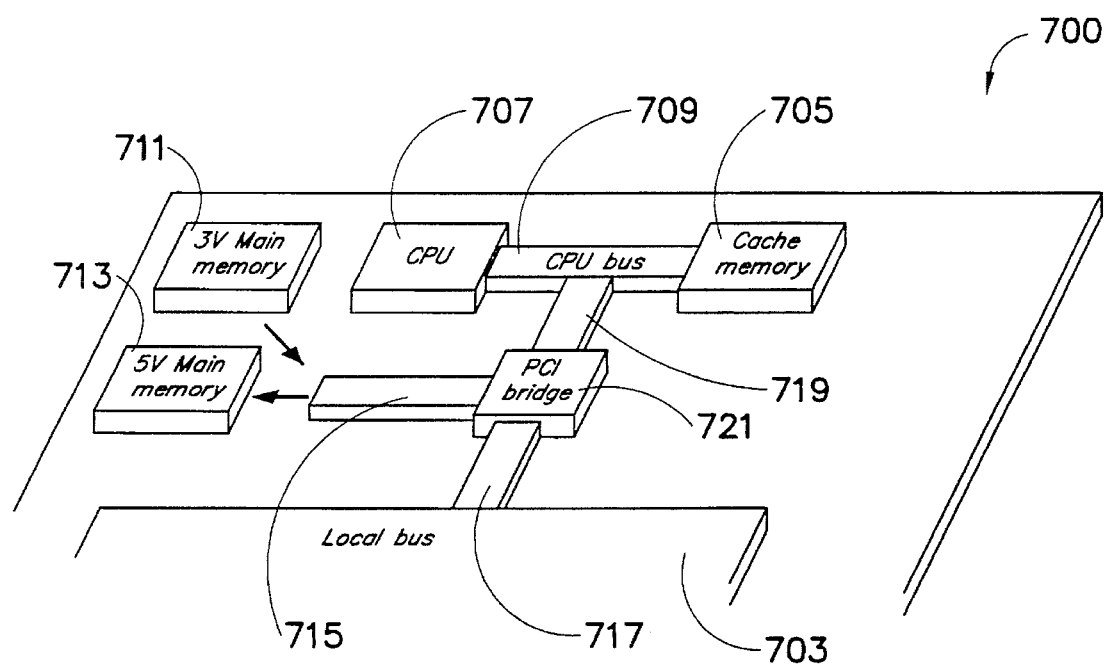
FIG. 13 is a further alternative embodiment of the present integrated circuit.

FIG. 13 illustrates a block diagram of an embodiment with use of a personal computer (PC) 700 according to the present invention. The embodiment includes typical PC hardware elements such as a local bus 703, cache memory 705, central processing unit (CPU) 707, CPU (central processing unit) bus 709, 3.3 volt main memory, 5.0 volt main memory, interface means 715 and 717, and other elements. A PCI (peripheral component interconnect) bridge integrated circuit 721 according to the present invention may connect the local bus to the CPU, cache memory, and main memories.

The PCI bridge includes a core region, peripheral circuits, and other elements according to the present invention, and therefore may interface with different circuit elements, each having a different power supply level and/or signal levels. In this example, the PCI bridge may be connected to 3.3 volt main memory or 5.0 volt main memory through an I/O interface. Alternatively, the CPU bus which provides the interface between the CPU and PCI bridge can have a reference voltage at either 5 volts or 3.3 volts, and others. The internal circuitry or core of the PCI bridge may be connected to a power supply of 3.3 volts for low voltage application, or 5 volts for high speed application. Of course, the peripheral circuitry for each of the circuit element groups in the PCI bridge may also include the availability of a plurality of power voltage levels V1, V2, V3 ... $V_n$. Each of the different alternatives as discussed above can be performed independently from each other.

While the above is a full description of the specific embodiments, various modifications, alternative constructions, and equivalents may be used. For example, while the description above is in terms of a gate array and in particular a CMOS gate array it would be possible to implement the present invention with other cell-based or standard cell or full-custom designs. Such designs may employ technology including MOSFET, BiCMOS devices, bipolar transistors, among others.

Therefore, the above description and illustrations should not be taken as limiting the scope of the present invention which is defined by the appended claims.

What is claimed is:

1. A semiconductor integrated circuit comprising:

a core region, an input pad, an output pad, peripheral circuitry, and a plurality of power supply lines, each one of said power supply lines being coupled to one of a plurality of power supply voltage levels V1, V2, V3 ... Vm, one of said power supply lines being coupled to a power pad supplying any one of said plurality of power supply voltage levels;

an input circuit connected to a said plurality of said power supply lines and coupled between said core region and said input pad, said input circuit being a portion of said peripheral circuitry; and an output circuit connected to a of said plurality of said power supply lines and coupled between said core region and said output pad, said output circuit being a portion of said peripheral circuitry;

wherein said input circuit is adapted to receive an input signal at one of a plurality of voltage signal levels from said input pad and said output circuit is adapted to transmit an output signal at one of a plurality of voltage signal levels at said output pad.

2. The circuit of claim 1 wherein said input circuit comprises a translator for receiving said input signal and translating said input signal to a desired voltage range.

3. The circuit of claim 2 wherein said input circuit further comprises a level shifter coupled to said translator, said level shifter receiving said input signal and shifting said input signal to a preselected signal level.

4. The circuit of claim 1 wherein said input circuit comprises an electrostatic discharge circuit for receiving said input signal.

5. The circuit of claim 1 wherein said output circuit comprises a translator for receiving said output signal and translating said output signal to a desired voltage range.

6. The circuit of claim 5 wherein said output circuit further comprises a pre-driver coupled to said translator.

7. The circuit of claim 1 wherein said output circuit comprises an output driver for transmitting said output signal.

8. The circuit of claim 1 wherein said core region comprises CMOS devices.

9. The circuit of claim 1 wherein said input pad and said output pad are the same pad.

10. The circuit of claim 1 wherein one of said plurality of voltage levels is at 5 volts and another of said plurality of voltage levels is at 3.3 volts.

11. An integrated circuit comprising:

a core region comprising a plurality of cells;

a plurality of circuit element groups B1, B2, B3 ... Bn each coupled to said core region, each of said circuit element groups comprising power lines supplying a plurality of voltages V1, V2, V3 ... Vm;

a power pad coupled to one of said power lines, said power pad supplying any one of said plurality of voltages; and a plurality of input/output pads coupled to each of said plurality of circuit element groups, said pads comprising an input pad and an output pad;

wherein each of said circuit element groups comprising an output buffer, coupled to more than one of said power lines, to provide an output signal at said one of a plurality of signal levels to said output pad.

12. The integrated circuit of claim 11 wherein each of said circuit element groups further comprising an input buffer, coupled to more than one of said power lines, to receive a first input signal from said input pad, and provide an input signal at one of said plurality of signal levels to said core region.

13. The integrated circuit of claim 11 wherein said circuit element groups being separated by a power break cell, said power break cell isolating a portion of said power lines to at least one of said circuit element groups.

14. The integrated circuit of claim 11 wherein said output buffer comprises a translator coupled to said one of said plurality of voltages V1, V2, V3 ... Vm.

15. The integrated circuit of claim 11 wherein said output buffer comprises a pre-driver coupled to a translator.

16. The integrated circuit of claim 15 wherein said pre-driver is coupled to one of said power lines having the same voltage level as said core region.

17. The integrated circuit of claim 11 wherein said output buffer comprises an output driver coupled to one of said power lines at one of said plurality of voltage levels.

18. The integrated circuit of claim 12 wherein said input buffer comprises a level shifter coupled to said input pad.

19. The integrated circuit of claim 12 wherein said input buffer comprises an input translator coupled to a level shifter.

20. The integrated circuit of claim 12 wherein said input buffer and said output buffer comprise CMOS devices.

21. The integrated circuit of claim 12 wherein at least one of said circuit element groups comprise power lines at a single voltage level.

22. An integrated circuit comprising:

a core region, an input pad, an output pad, peripheral circuitry, and a plurality of power supply lines;

an output circuit connected to a plurality of said power supply lines and coupled between said core region and said output pad, said output circuit being a portion of said peripheral circuitry; and a first power pad connected to one of said plurality of power supply lines, said power pad supplying any one of a plurality of first power supply voltage levels V1, V2 ... $V_m$ (m>1);

wherein said output circuit transmits an output signal with reference to one of said plurality of first power supply voltage levels.

23. The integrated circuit of claim 22 further comprising:

an input circuit connected to a plurality of said power supply lines and coupled between said core region and said input pad, said input circuit being a portion of said peripheral circuitry; and a second power pad connected to one of said plurality of power supply lines, said second power pad supplying any one of a plurality of second power supply voltage levels V1, V2 ... $V_n$ (n>1);

wherein said input circuit transmits an input signal with reference to one of said plurality of second power supply voltage levels.

24. The integrated circuit of claim 23 wherein said first pad and said second pad are the same.

25. The integrated circuit of claim 23 wherein said output pad and said input pad are the same.

26. A method of supplying power to an integrated circuit device, said method comprising:

providing a semiconductor integrated circuit, said semiconductor integrated circuit comprising a core region, an input pad, an output pad, peripheral circuitry, a plurality of power supply lines, an output circuit connected to a plurality of said power supply lines and coupled between said core region and said output pad, said output circuit being a portion of said peripheral circuitry;

providing a first power pad connected to one of said plurality of power supply lines;

supplying any one of a plurality of first power supply voltage levels V1, V2 ... $V_m$ (m>1) to said first power pad;

transmitting through said output circuit an output signal with reference to one of said plurality of first power supply voltage levels.

27. The integrated circuit of claim 26 further comprising:

providing an input circuit connected to a plurality of said power supply lines and coupled between said core region and said input pad, said input circuit being a portion of said peripheral circuitry;

providing a second power pad connected to one of said plurality of power supply lines, said second power pad supplying any one of a plurality of second power supply voltage levels V1, V2 ... $V_n$ (n>1); and transmitting through said input circuit an input signal with reference to one of said plurality of second power supply voltage levels.

* * * * *